United States Patent
Mertens et al.

(10) Patent No.: US 7,224,433 B2
(45) Date of Patent: May 29, 2007

(54) METHOD AND APPARATUS FOR IMMERSION LITHOGRAPHY

(75) Inventors: Paul Mertens, Bonheiden (BE); Wim Fyen, Leuven (BE)

(73) Assignee: Interuniversitair Microelektronica Centrum (IMEC), Leuven (BE)

(*) Notice: Subject to any disclaimer, the term of this patent is extended or adjusted under 35 U.S.C. 154(b) by 13 days.

(21) Appl. No.: 11/174,103

(22) Filed: Jul. 1, 2005

(65) Prior Publication Data

US 2006/0000381 A1  Jan. 5, 2006

Related U.S. Application Data

(60) Provisional application No. 60/584,541, filed on Jul. 1, 2004.

(51) Int. Cl.
  *G03B 27/42* (2006.01)
  *G03B 27/52* (2006.01)
  *G03B 27/58* (2006.01)
  *G03B 27/32* (2006.01)

(52) U.S. Cl. .................. 355/53; 355/30; 355/72; 355/77

(58) Field of Classification Search ............... 355/30, 355/53, 72, 77
See application file for complete search history.

(56) References Cited

U.S. PATENT DOCUMENTS 5,660,642 A  8/1997  Britten ................ 134/30

6,867,844 B2 *  3/2005  Vogel et al. ............ 355/30
2004/0075895 A1 *  4/2004  Lin ...................... 359/380

FOREIGN PATENT DOCUMENTS

EP           1 420 298        5/2004
WO     WO 2005/003864       1/2005

OTHER PUBLICATIONS

European Search Report for PCT application of Interuniversitair Micro-Elektronica Centrum, EP 05 44 7154 dated Mar. 16, 2006.
*Immersion Lithography; its potential performance and issues*, Optical Microlithography XVI, Anthony Yen, Editor, Proceedings of SPIE, vol. 5040 (2003), pp. 724-733.
Jalal J. Jafar and Peter M. Budd, *Separation of alcohol/water mixtures by pervaporation through zeolite A membranes*, Microporous Materials 12 (1997), pp. 305-311.

* cited by examiner

*Primary Examiner*—Alan Mathews
(74) *Attorney, Agent, or Firm*—McDonnell Boehnen Hulbert & Berghoff LLP

(57) ABSTRACT

A method and apparatus for immersion lithography is described. The method includes positioning a semiconductor substrate under an optical immersion head assembly, providing an immersion liquid between the substrate and the optical immersion head assembly, and supplying a tensio-active gaseous substance along the perimeter of the contact area of the immersion liquid and the substrate. The immersion liquid contacts at least an area of the substrate. The tensio-active gaseous substance is chosen such that, when at least partially mixed with the immersion liquid, the mixture has a lower surface tension than the immersion liquid, thereby creating a surface tension gradient pulling the immersion liquid from the perimeter towards an inside portion of the contact area.

21 Claims, 6 Drawing Sheets

METHOD AND APPARATUS FOR IMMERSION LITHOGRAPHY

RELATED APPLICATIONS

The present patent application claims priority under 35 U.S.C. § 119(e) to U.S. Provisional Patent Application Ser. No. 60/584,541, which was filed Jul. 1, 2004. The full disclosure of U.S. Provisional Patent Application Ser. No. 60/584,541 is incorporated herein by reference.

FIELD

The invention relates to a method for immersion lithography. The invention further relates to an apparatus suitable for performing the method according to the invention.

BACKGROUND

Optical lithography is a semiconductor processing technique that uses light to transfer a pattern onto a silicon wafer. However, optical lithography cannot meet reduced pattern size requirements as devices become smaller. Immersion lithography is currently being used to transfer patterns that are too small for standard optical lithography methods. In immersion lithography, a pattern is projected onto a semiconductor substrate coated with a photoresist layer, while a space in between a lens and the photoresist layer is filled with an immersion liquid (e.g., ultra pure water).

In a typical configuration, the immersion liquid is supplied on one side of an optical immersion head assembly and drained at the other side of the optical immersion head assembly as shown in FIG. 1 (presented by B. J. Lin on Arch Interface 2003). Typically, the semiconductor substrate can move relative to the optical immersion head assembly, while the immersion liquid layer is maintained and kept confined to a zone under treatment.

One of the critical aspects of immersion lithography is the formation of gas bubbles at an interface between the photoresist and the substrate. The gas bubbles have been found to be detrimental as they locally distort the optical beam. In order to suppress bubble formation, the (dissolved) gas content of the liquid needs to be kept low.

Another approach to minimizing bubble formation is to reduce the contact angle of the fluid on top of the photoresist layer, or in other words, to improve the wetting of the photoresist by the immersion liquid. This can be done by using photoresist layers with a more liquid-philic (i.e., a liquid with a small contact angle) top surface. However, this approach makes the confinement of the liquid to the zone under treatment much more difficult. As a result, an undesired leakage from the zone between the optical immersion head assembly and the substrate may occur. Such liquid left behind on the treated area then typically evaporates, which is also undesirable. In the field of wafer cleaning, it is well established that improper wafer drying (involving excess evaporation) can typically lead to characteristic residues left behind, often referred to as drying marks or water marks.

The current invention provides extra latitude in the trade-off between gas-bubble formation because of poor wetting of the substrate by the immersion liquid on the one hand and the occurrence of immersion liquid leakage and liquid evaporation on the other hand. Furthermore, the current invention reduces the risk of drying residue formation.

SUMMARY

In a first aspect of this invention, a method for immersion lithography is disclosed. The method includes positioning a semiconductor substrate under an optical immersion head assembly, providing an immersion liquid between the substrate and the optical immersion head assembly, and supplying a tensio-active gaseous substance along a perimeter of a contact area of the immersion liquid and the substrate. The immersion liquid contacts at least an area of the substrate.

The immersion liquid is essentially water. The tensio-active gaseous substance is chosen such that, when at least partially mixed with the immersion liquid, a mixture is formed with a lower surface tension than the immersion liquid. The mixture creates a surface tension gradient that pulls the immersion liquid from the perimeter towards the contact area.

The tensio-active gaseous substance and a concentration of the tensio-active gaseous substance are selected to be compatible with a photoresist. In one example, the tensio-active gaseous substance is selected from the group consisting of isopropylalcohol (IPA), butanol, ethanol, hexanol, equivalents, and a mixture thereof. In another example, the tensio-active gaseous substance comprises IPA vapor. In yet another example, the tensio-active gaseous substance comprises IPA vapor and a vapor of the immersion liquid. Preferably, the tensio-active gaseous substance comprises a mixture of IPA and $N_2$ vapor.

In a second aspect of this invention, an apparatus for immersion lithography is disclosed. The apparatus includes a means for holding a substrate, an optical immersion head assembly, a means for supplying an immersion liquid between the substrate and the optical immersion head assembly, and a means for supplying a tensio-active gaseous substance. The means for supplying the tensio-active gaseous substance provides a tensio-active gaseous substance along a perimeter of a contact area of the immersion liquid and the substrate, such that upon supply, a surface tension gradient is created pulling the immersion liquid from the perimeter towards an inside portion of the contact area.

The means for supplying the tensio-active gaseous substance supplies the tensio-active gaseous mixture to different sections along the perimeter of the contact area. In each section, the confinement of the immersion liquid can be optimized separately. As an example, the different sections are selected according to a local orientation of the perimeter with respect to a relative velocity vector ($V_{rel}$). A possible division is in three different types of sections (see, e.g., FIG. 7).

In order to describe the different sections, a local normal vector is defined as a vector that is locally perpendicular to the perimeter pointing outside of the contact area. These three types of sections are: 1) a side part where the relative velocity is essentially parallel to the local tangent of the perimeter; 2) an advancing part, where the relative velocity vector is essentially parallel to the local normal vector and essentially pointing into the same direction; and 3) a receding part where the relative velocity vector is essentially parallel to the local normal vector and essentially pointing into the opposite direction.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
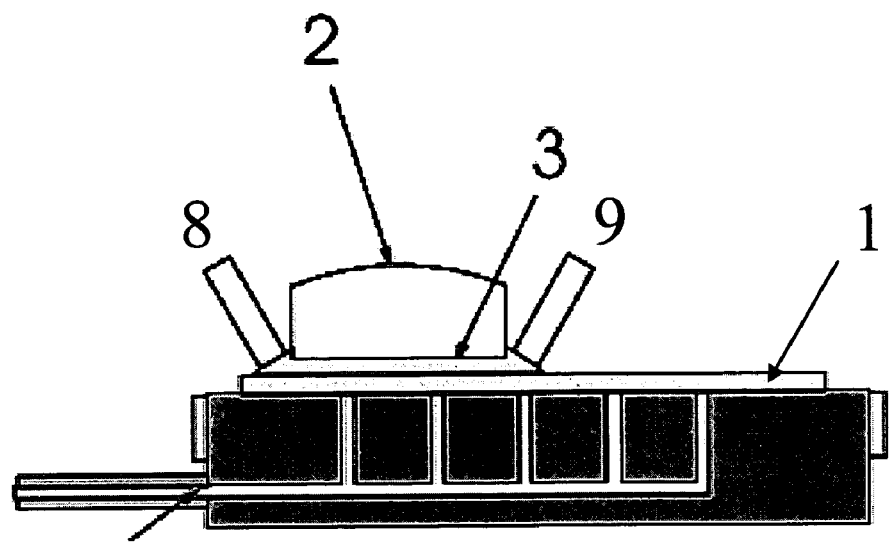
FIG. 1 is a cross-sectional block diagram of an apparatus used for immersion lithography, according to an example.
Figure 2:
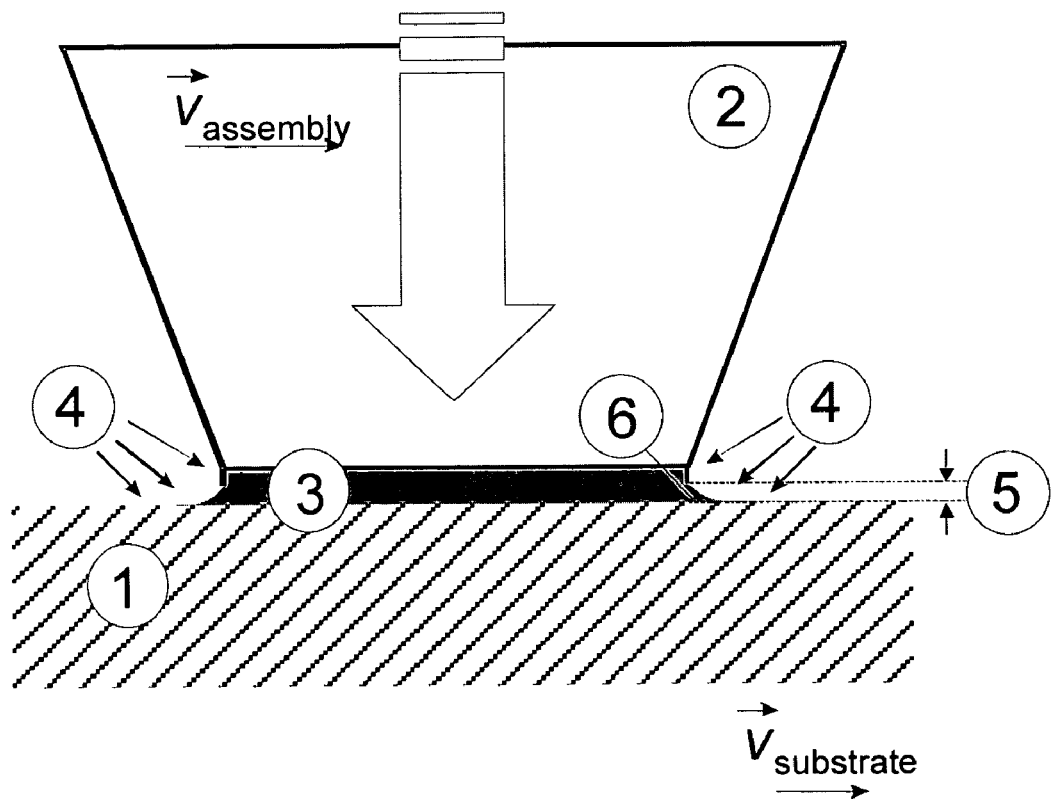
FIG. 2 is a cross-sectional block diagram of an apparatus used for immersion lithography, according to an example.

The method and apparatus of the current invention is illustrated with reference to FIG. 2. A semiconductor substrate 1 with photoresist (further called the substrate) to be treated is mounted. The substrate 1 can move in a plane essentially parallel to its surface with a velocity $V_{substrate}$.

The optical immersion head assembly 2 is facing the surface of the substrate to be treated. The optical immersion head assembly 2 can move with a velocity $V_{assembly}$ in a plane parallel to the surface of the substrate 1. Thus, a relative velocity of the substrate 1 with respect to the optical immersion head assembly 2 is $V_{rel}=V_{substrate}-V_{assembly}$. In most cases, the optical immersion head assembly 2 is mounted to be stationary. When the optical immersion head assembly 2 is stationary, $V_{assembly}$ is equal to zero. In general, $V_{rel}$ is not equal to zero, but at some time-intervals $V_{rel}$ can be temporarily equal to zero.

An immersion liquid 3 is present in between the optical immersion head assembly 2 and the substrate 1. A gap 5 is present in between the surface of the substrate 1 and a bottom of the optical immersion head assembly 2. Typically, the gap 5 is on the order of a few hundred micrometers to a few millimeters. The gap 5 assists in the confinement of the immersion liquid.

A tensio-active gaseous substance 4 is present next to the gap 5. The tensio-active gaseous substance 4 is a substance that, when mixed with a liquid, yields a mixture with lower surface tension than the liquid. The tensio-active gaseous substance 4 can comprise a vaporized substance that is miscible with the liquid and when mixed with the liquid yields a mixture having a surface tension being lower than that of the liquid.

A vaporized substance is defined as a mist of finely dispersed liquid droplets of an element, a compound, a mixture of elements, or a vapor. A vapor is defined as a specific gas phase occurrence of an element, a compound, or a mixture of elements. The vapor is a gas phase that can co-exist in one environment with the solid or liquid phase of the element.

The tensio-active gaseous substance 4 can comprise a gas that is miscible with a liquid and when mixed with the liquid yields a mixture having a surface tension being lower than that of the liquid. The tensio-active gaseous substance 4 can comprise a mixture of a vaporized substance and a gas, particularly an inert gas, such as helium, argon, or nitrogen. The mixture is at least partially miscible with the liquid and, when mixed with the liquid, yields a mixture having a surface tension being lower than that of the liquid.

The presence of the tensio-active gaseous substance 4 creates a three-phase region 6 (i.e., solid substrate, immersion liquid, and gaseous substance) along a perimeter of a contact area of the immersion liquid 3 to the substrate 1, resulting in a surface tension gradient in the surface of the liquid phase. The surface tension gradient pulls the immersion liquid 3 from the perimeter towards an inside portion of the contact area. This surface tension gradient results in better confinement of the immersion liquid 3. Furthermore, the amount of liquid left behind on the surface at the receding part of the perimeter is reduced, particularly in the case of a surface with a more liquid-philic character.

The tensio-active gaseous substance 4 is chosen such that the tensio-active gaseous substance 4 can reduce surface tension. The following properties are used to choose the tensio-active gaseous substance 4:

Sufficient surface tension reduction upon mixed into the immersion liquid 3;

Sufficiently soluble in the immersion liquid 3;

Compatible with the substrate 1 (typically photoresist); and

Compatible with the optical requirements of the immersion liquid 3, i.e., the concentration of the tensio-active gaseous substance 4 used should not disturb the lithographic printing process through changes in refractive index.

Figure 3:
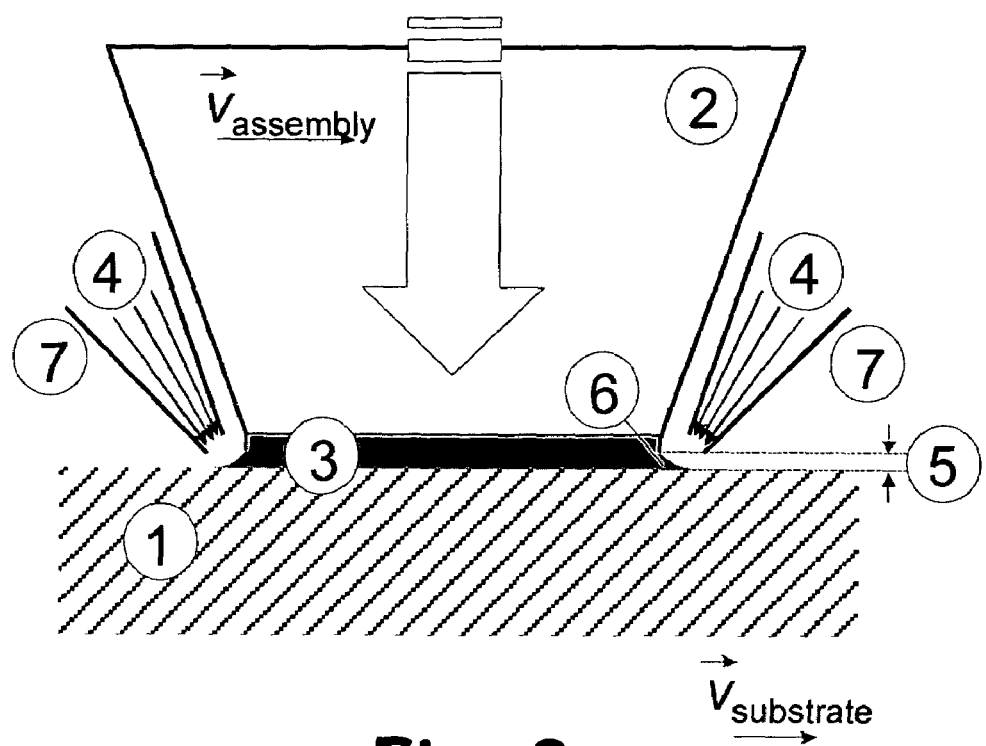
FIG. 3 is a cross-sectional block diagram of an apparatus used for immersion lithography depicting the use of a nozzle to direct the supply of a tensio-active gaseous substance, according to an example.

The tensio-active gaseous substance may be present at the perimeter of the contact area. However, it was found that supplying the tensio-active gaseous substance 4 with a gas flow well directed to the three-phase region 6 further improves the confinement and drying capabilities. This can be obtained by dispensing the tensio-active gaseous substance 4 through a supply providing a jet directed to the three-phase region 6. This can be obtained by using a concentric circle of nozzles or a nozzle with a narrow slit-shaped outlet 7 directed to the three-phase region 6, and mounted around the optical immersion head assembly 2 as depicted in FIG. 3. Adjacent to the slit-shaped nozzle 7, an exhaust channel (not shown in the figure) can be mounted in order to exhaust the excess of tensio-active gaseous substance 4.

Figure 7:
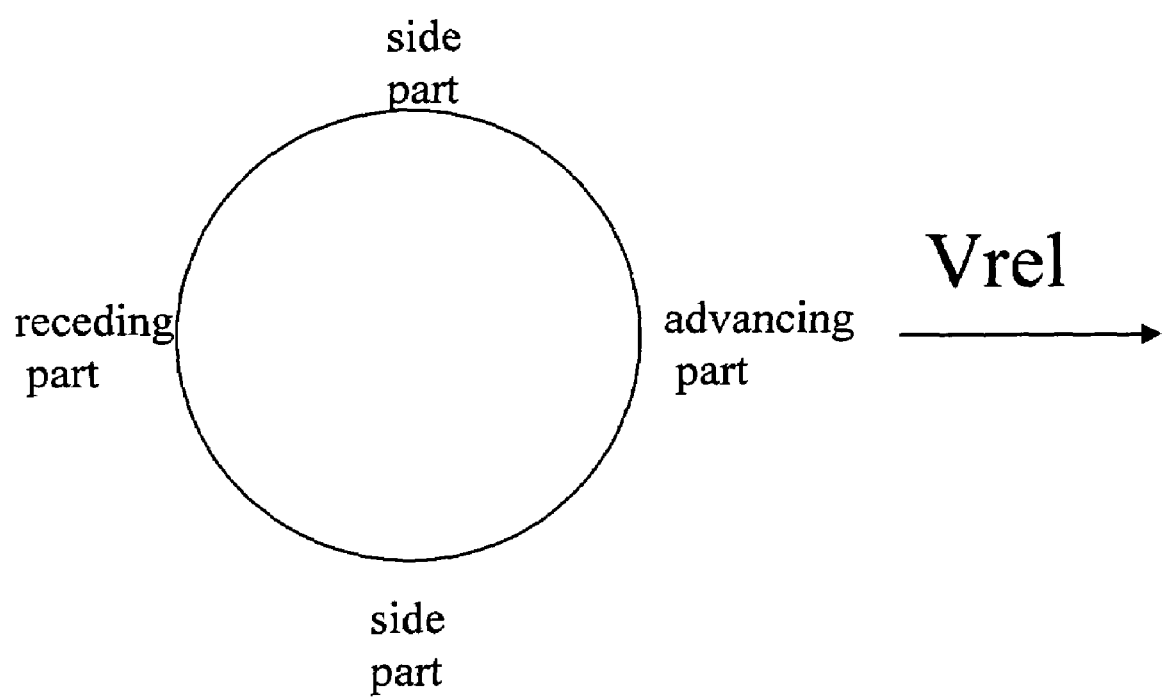
FIG. 7 is a diagram depicting three different regions in which a tensio-active gaseous substance is supplied, according to an example.

The tensio-active gaseous substance 4 may be supplied separately in different sections along the perimeter of the contact area. In each section, the confinement of the immersion liquid 3 can be optimized separately by using separate nozzles in each section. The flow rate of the tensio-active gaseous substance 4 and/or the position of the nozzles directed to the perimeter of the contact area may be optimized in each section. As an example, different sections are selected according to the local orientation of the perimeter with respect to the relative velocity vector ($V_{rel}$). A possible division is in three different types of sections as depicted in FIG. 7.

In order to describe the different sections, a local normal vector is defined as a vector that is locally perpendicular to the perimeter pointing outside of the contact area. These three types of sections are: 1) a side part where the relative velocity is essentially parallel to the local tangent of the perimeter; 2) an advancing part, where the relative velocity vector is essentially parallel to the local normal vector and essentially pointing into the same direction; and 3) a receding part where the relative velocity vector is essentially parallel to the local normal vector and essentially pointing into the opposite direction.

Figure 4:
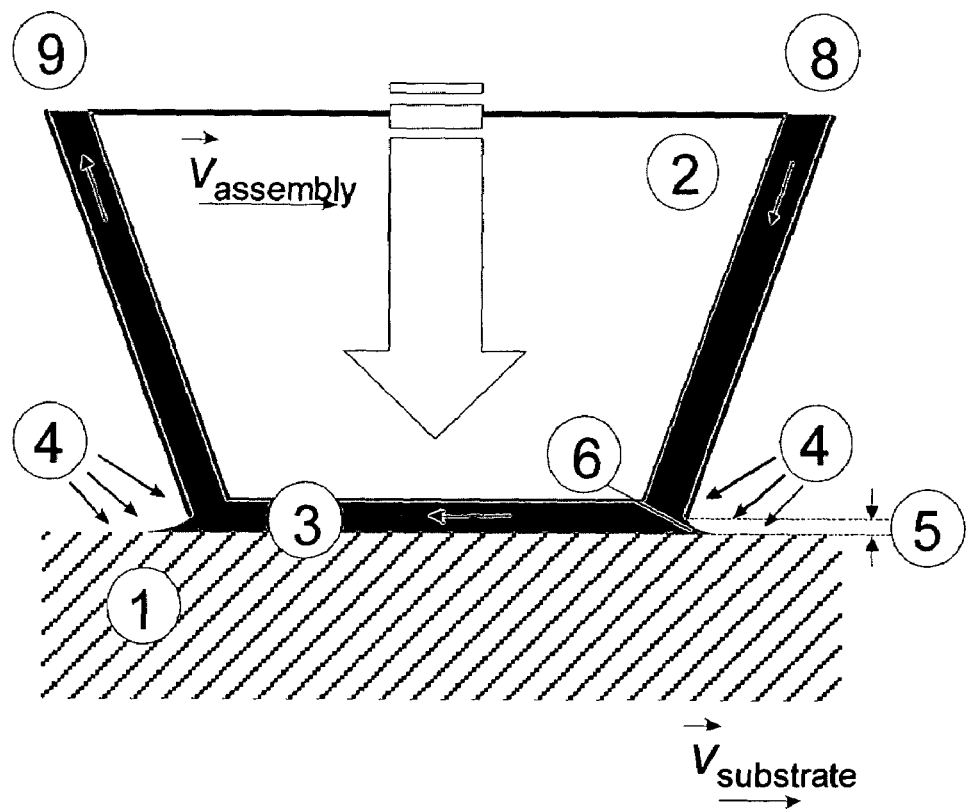
FIG. 4 is a cross-sectional block diagram of an apparatus used for immersion lithography depicting a liquid feed-through supply, according to an example.
Figure 5:
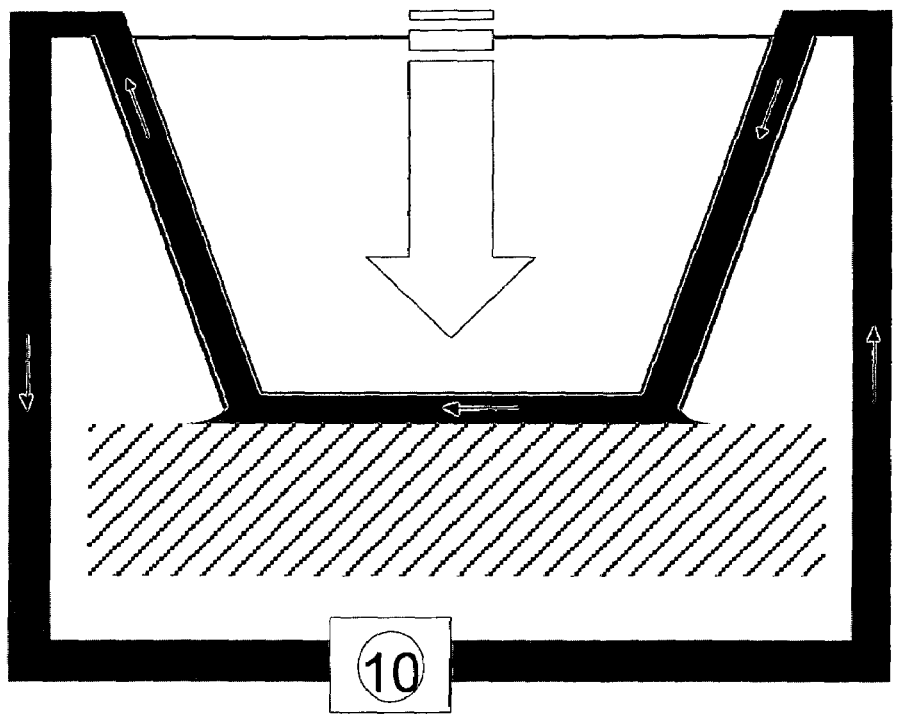
FIG. 5 is a cross-sectional block diagram of an apparatus used for immersion lithography depicting a liquid recirculation unit, according to an example.
Figure 6:
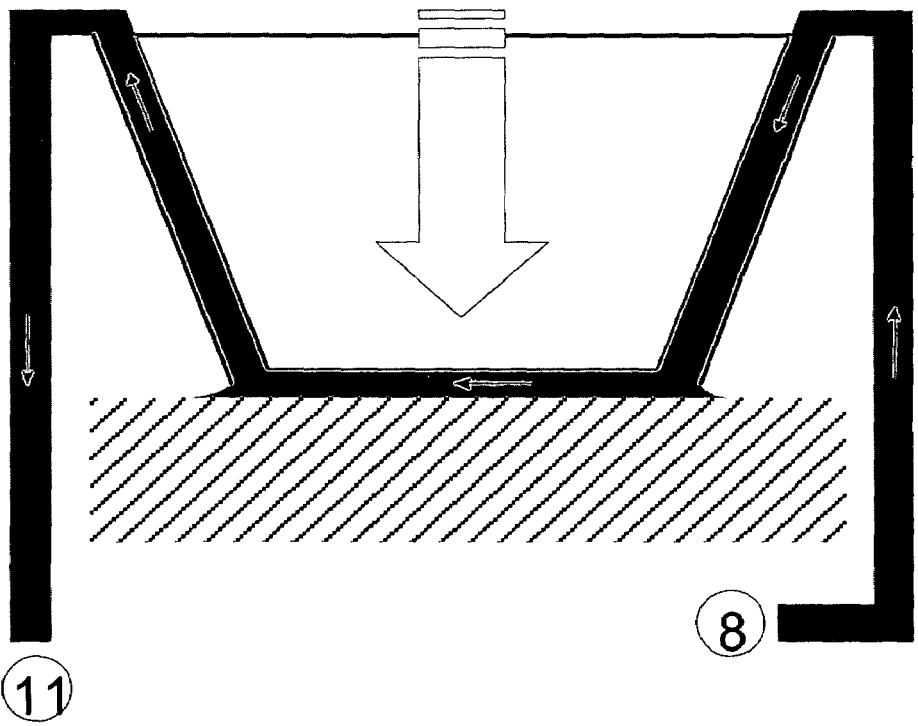
FIG. 6 is a cross-sectional block diagram of an apparatus used for immersion lithography depicting a single-pass liquid supply system, according to an example.

The immersion liquid 3 can be supplied from a supply 8 and drained away on the other side 9 as shown in FIG. 4. The immersion liquid 3 could be used fresh and drained into a waste collection system 11 as shown in FIG. 6. Alternatively, the immersion liquid 3 could be reused through a recirculation device 10 as shown in FIG. 5. The immersion liquid 3 could be treated (e.g., regenerated, purified, filtered, degassed, etc. . . . ) in this recirculation device 10 if needed. If recirculation is chosen, the lifetime of the immersion liquid 3 may be determined by build-up (loading) of dissolved tensio-active gaseous substance 4 in the immersion liquid 3. If a certain limit concentration is exceeded, the immersion liquid 3 may not be suitable for use anymore and may need to be replenished.

The tensio-active gaseous substance 4 and the concentration of the tensio-active gaseous substance 4 are selected and optimized to be compatible with the photoresist. A high concentration of isopropylalcohol (IPA), as an example, is known to partially dissolve some types of photoresist. Typically, the immersion liquid 3 can essentially be water. In that case, the tensio-active gaseous substance 4 may be selected from the group consisting of IPA, butanol, ethanol, hexanol, equivalents, and a mixture thereof.

Preferably, the immersion liquid 3 is essentially water, while the tensio-active gaseous substance 4 is a mixture of IPA vapor and immersion liquid vapor, or a mixture of IPA vapor and $N_2$ vapor. The IPA vapor may be generated by bubbling $N_2$ through liquid IPA, obtaining a mixture of IPA vapor and $N_2$ vapor. A mist of the tensio-active gaseous substance 4 can be generated by exposing a liquid phase of the tensio-active gaseous substance 4 to a high frequency (e.g., 1 MHz) acoustic agitation.

The higher the flow rate of the tensio-active gaseous substance 4, the higher the maximum relative velocity of the moving substrate 1 is with respect to the optical immersion head assembly 2. For example, if a flow of $N_2$ saturated with IPA is generated by bubbling $N_2$ through liquid IPA at a rate of 0.5 SLM (standard liter per minute) per centimeter length of the three phase region, the maximum relative velocity between the optical immersion head assembly 2 and the substrate 1 is approximately 8 mm/s.

A further advantage is that the amount of liquid left behind that can dry by evaporation is reduced, thereby reducing significantly the risk for watermark formation. No additional drying of the substrate 1 is needed after immersion lithography. Furthermore, it is now possible to have equipment parts that are not water compatible in the immersion lithography tool because the immersion liquid 3 is confined between the optical immersion head assembly 2 and the substrate 1, without the need of a fully immersed system.

EXAMPLE

Figure 8:
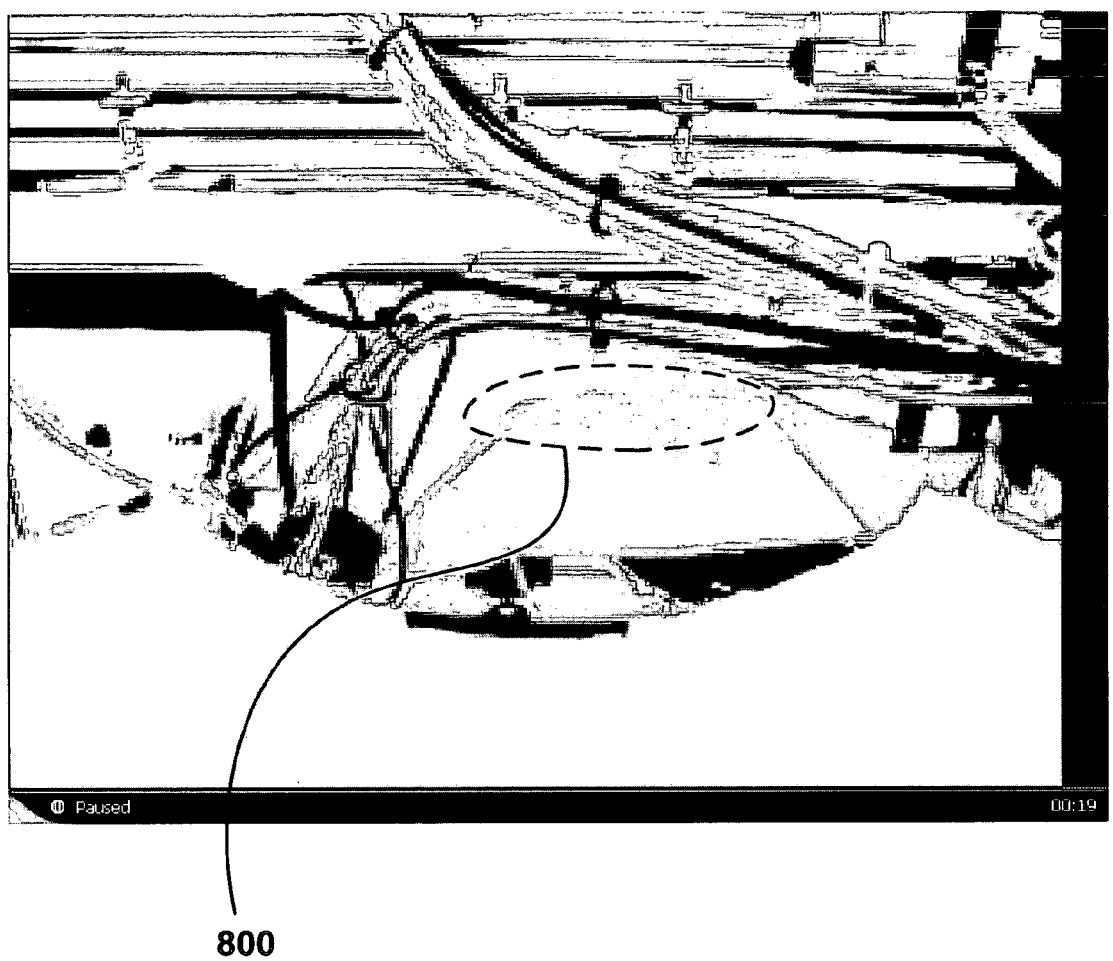
FIG. 8 is a photograph of a test setup, according to an example.

The feasibility of IPA assisted immersion scanning was demonstrated on hydrophilic Si surfaces, using an ASML 1150i showerhead. In FIG. 8, the showerhead moves at a scan speed of 125 mm/s from left to right. No IPA is provided along the perimeter of the contact area of the immersion liquid to the wafer surface. After the movement, parallel lines of immersion liquid 800 are left on the wafer surface.

Figure 9:
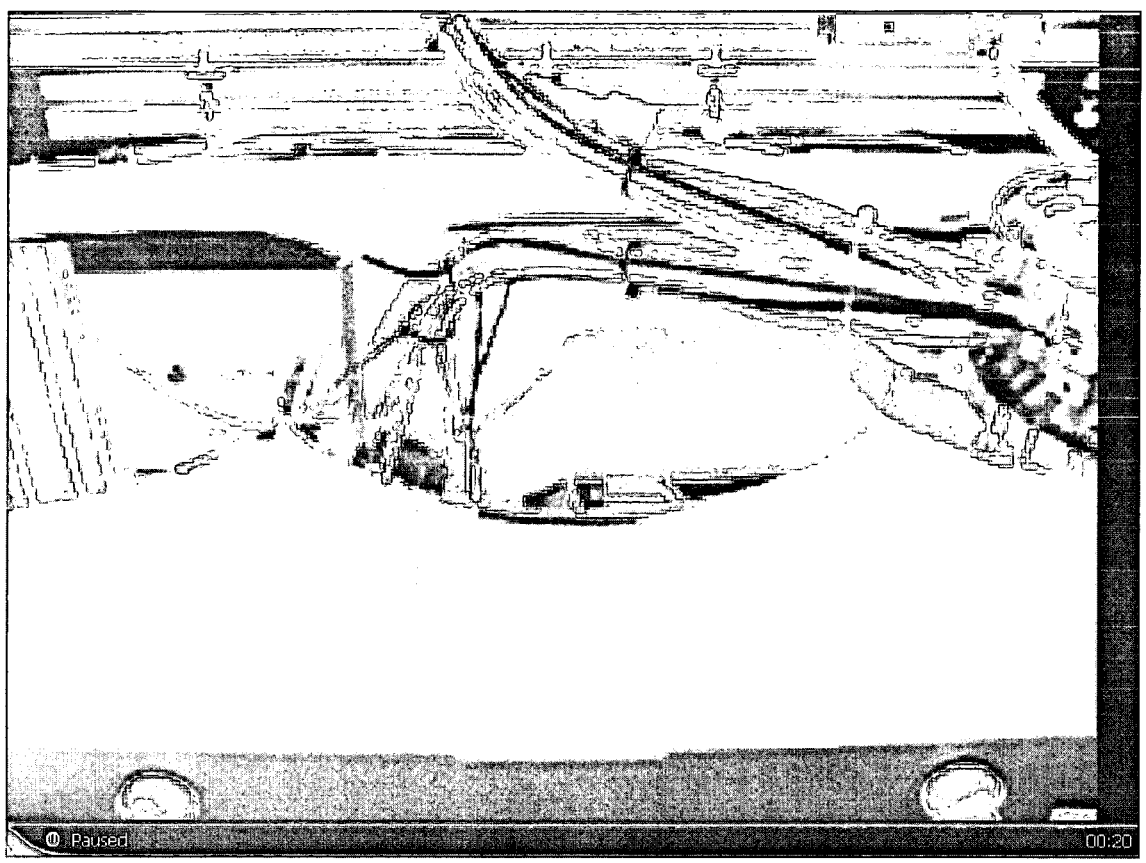
FIG. 9 is a photograph of a test setup, according to another example.

In FIG. 9, again the showerhead moves at a scan speed of 125 mm/s from left to right. IPA is provided by a concentric circle of small nozzles along the perimeter of the contact area. Substantially no immersion liquid is left on the wafer surface.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A method for immersion lithography, comprising in combination:
   positioning a substrate under an optical immersion head assembly;
   providing an immersion liquid between the substrate and the optical immersion head assembly, wherein the immersion liquid contacts at least an area of the substrate; and
   supplying a tensio-active gaseous substance to different sections along a perimeter of the contact area of the immersion liquid and the substrate,
   wherein the tensio-active gaseous substance at least partially mixed with the immersion liquid forms a mixture having a lower surface tension than the immersion liquid, thereby creating a surface tension gradient pulling the immersion liquid from the perimeter towards an inside portion of the contact area, and
   wherein confinement of the immersion liquid is separately optimized at each of the different sections.

2. A method according to claim 1, wherein the tensio-active gaseous substance and a concentration of the tensio-active gaseous substance are selected to be compatible with a photoresist.

3. A method according to claim 1, wherein the tensio-active gaseous substance is selected from the group consisting of isopropylalcohol (IPA), butanol, ethanol, hexanol, equivalents, and a mixture thereof.

4. A method according to claim 1, wherein the tensio-active gaseous substance comprises IPA vapor.

5. A method according to claim 1, wherein the tensio-active gaseous substance comprises IPA vapor and a vapor of the immersion liquid.

6. A method according to claim 3, wherein the tensio-active gaseous substance further comprises an inert gas.

7. A method according to claim 1, wherein the tensio-active gaseous substance comprises a mixture of IPA and $N_2$ vapor.

8. A method according to claim 1, wherein the different sections are selected according to a local orientation of the perimeter with respect to a relative velocity vector.

9. A method according to claim 1, wherein the different sections are divided in a side part, an advancing part, and a receding part.

10. A method according to claim 1, wherein supplying the tensio-active gaseous substance comprises providing a jet directed to the perimeter of the contact area.

11. A method according to claim 1, wherein the tensio-active gaseous substance is supplied through a slit-shaped outlet directed to the perimeter of the contact area and mounted around the optical immersion head assembly.

12. A method according to claim 1, wherein supplying the immersion liquid comprises supplying the immersion liquid at one side of the optical immersion head assembly and draining the immersion liquid at another side of the optical immersion head assembly.

13. A method according to claim 1, further comprising re-circulating the immersion liquid.

14. A method according to claim 1, further comprising treating the immersion liquid.

15. An apparatus for immersion lithography, comprising in combination:
   means for holding a substrate;
   an optical immersion head assembly;
   means for supplying an immersion liquid between the substrate and the optical immersion head assembly; and
   means for supplying a tensio-active gaseous substance is separated into different sections along a perimeter of a contact area of the immersion liquid and the substrate, wherein a surface tension gradient is created pulling the immersion liquid from the perimeter towards an inside portion of the contact area, and
   wherein the means for supplying the tensio-active gaseous substance is suitable for separately optimizing confinement of the immersion liquid in each of the different sections.

16. An apparatus according to claim 15, wherein the different sections are selected according to a local orientation of the perimeter with respect to a relative velocity vector.

17. An apparatus according to claim 15, wherein the different sections are divided into a side part, an advancing part, and a receding part.

18. An apparatus according to claim 15, wherein the means for supplying the tensio-active gaseous substance comprises a device providing a jet directed to the perimeter of the contact area.

19. An apparatus according to claim 15, wherein the means for supplying a tensio-active gaseous substance comprises a nozzle with a slit-shaped outlet directed to the perimeter of the contact area and mounted around the optical immersion head assembly.

20. An apparatus according to claim 15, wherein the means for supplying the immersion liquid is arranged to supply the immersion liquid at one side of the optical immersion head assembly and drain the immersion liquid at another side of the optical immersion head assembly.

21. An apparatus according to claim 15, further comprising a recirculation device arranged to treat the immersion liquid.

* * * * *